United States Patent [19]
Byers et al.

[11] Patent Number: 5,788,509
[45] Date of Patent: Aug. 4, 1998

[54] AUDIO CONNECTOR CARD FOR BABY-AT MOTHERBOARD IN A PERSONAL COMPUTER/SERVER

[75] Inventors: Kirk Byers, Portland; Jerald N. Hall, Scappoose; Ravi Nagaraj; Peter Ward, both of Hillsboro, all of Oreg.

[73] Assignee: Intel Corporation, Santa Clara, Calif.

[21] Appl. No.: 745,491

[22] Filed: Nov. 12, 1996

Related U.S. Application Data

[62] Division of Ser. No. 395,848, Feb. 28, 1995.

[51] Int. Cl.⁶ .................................................... H01R 9/09
[52] U.S. Cl. ................................................ 439/61; 361/788
[58] Field of Search ............................. 439/61, 62, 63, 439/65, 59, 76, 79, 638; 361/788, 796, 785

[56] References Cited

U.S. PATENT DOCUMENTS

| | | |
|---|---|---|
| 4,573,753 | 3/1986 | Vogl .................................. 439/76.1 |
| 4,744,006 | 5/1988 | Duffield ............................... 439/61 |
| 5,064,388 | 11/1991 | Paladel ............................... 439/607 |

*Primary Examiner*—Neil Abrams
*Assistant Examiner*—T. C. Patel
*Attorney, Agent, or Firm*—Owen L. Lamb

[57] ABSTRACT

A computer having a motherboard housed in a chassis having a bottom panel and a rear panel perpendicular to the bottom panel. The rear panel has a cutout therein. The motherboard is secured to the chassis in parallel with the bottom panel. The motherboard has a socket and the audio card is mounted in the socket perpendicular to the motherboard. The audio card has connectors, such as audio line-in, line-out, microphone, speaker power and game port, mounted perpendicular to the audio card such that the connectors are aligned with the cutout in the rear panel. The audio card is grounded to the chassis with an electromagnetic interference (EMI) gasket contoured to the cutout.

14 Claims, 3 Drawing Sheets

AUDIO CONNECTOR CARD FOR BABY-AT MOTHERBOARD IN A PERSONAL COMPUTER/SERVER

This application is a division of application Ser. No. 08/395,848 filed Feb. 28, 1995 which application is now pending.

BACKGROUND OF THE INVENTION

1. Field of the Invention

The present invention is related to personal computers and more particularly to an apparatus that provides audio connectors to a motherboard of a computer.

2. Background Art

A personal computer is a stand-alone desktop computer housed in a chassis which is a cover that protects the computer components from the environment and the environment from the computer. Input/output (I/O) devices, such as a video monitor, mouse and printer are connected to a back panel of the chassis by means of cables that plug into connectors at a back panel of the chassis.

Multimedia is a term used to describe the presentation of data on a personal computer using sound, video, graphics and text for entertainment and educational purposes. Some multimedia equipped computers provide audio connectors on the back panel, in addition to the I/O connectors, so that users can connect a microphone, audio line-in and line-out, speaker outputs and a game joystick input. Inside the computer chassis is a system board, called a motherboard, that holds the electronic components of the computer. There is no prior art adding an audio subsystem to a Baby-AT motherboard. Existing means of providing additional I/O connections from a motherboard to the rear panel of a Baby-AT chassis requires using cables and unique cutouts in the rear panel. Audio connectors (Line-in, Line-out, Microphone, Game port) are connected to Baby-AT motherboards by cables from the Baby-AT motherboard to sockets fastened in unique cut-outs in the back panel of the chassis that accommodate the audio connectors. Cables tend to be expensive, prone to noise, messy, and unreliable. Unique cut-outs are required in the chassis to accommodate the audio connectors. Unique cut-outs cost extra money and do not allow the sale of motherboards to customers whose chassis do not have the unique cut-outs.

Electromagnetic interference (EMI) is a problem in prior art. In the prior art EMI suppressive components are located on the motherboard which is a substantial distance from the audio connectors.

It is therefore desirable to be able to add audio connectors to Baby-AT motherboards which would not otherwise have space for these connectors.

SUMMARY OF THE INVENTION

Briefly, the invention is concerned with a computer having a motherboard housed in a chassis having a bottom panel and a rear panel perpendicular to the bottom panel. The rear panel has cutouts therein to accommodate standard expansion cards. The motherboard is secured to the chassis in parallel with the bottom panel. The motherboard has a socket with an audio card being mounted in the socket perpendicular to the motherboard. The audio card has connectors such as audio line-in, line-out, microphone, speaker power and game port connectors mounted on the audio card. The connectors are mounted on an edge of the audio card such that the connectors are aligned with a cutout in the rear panel when the card is inserted in its socket. The connectors are secured and grounded to the chassis with an electromagnetic interference (EMI) gasket contoured to the cutout. The pin assignments of the audio card socket are chosen to maximize shielding and allow easy routing.

The invention has the advantage that it allows the marketing of Baby-AT motherboards with an audio sub-system to customers who do not want to modify their chassis.

The invention has the advantage of lower cost, higher reliability, and higher audio quality than the prior art.

DESCRIPTION OF THE PREFERRED EMBODIMENT

Figure 1:
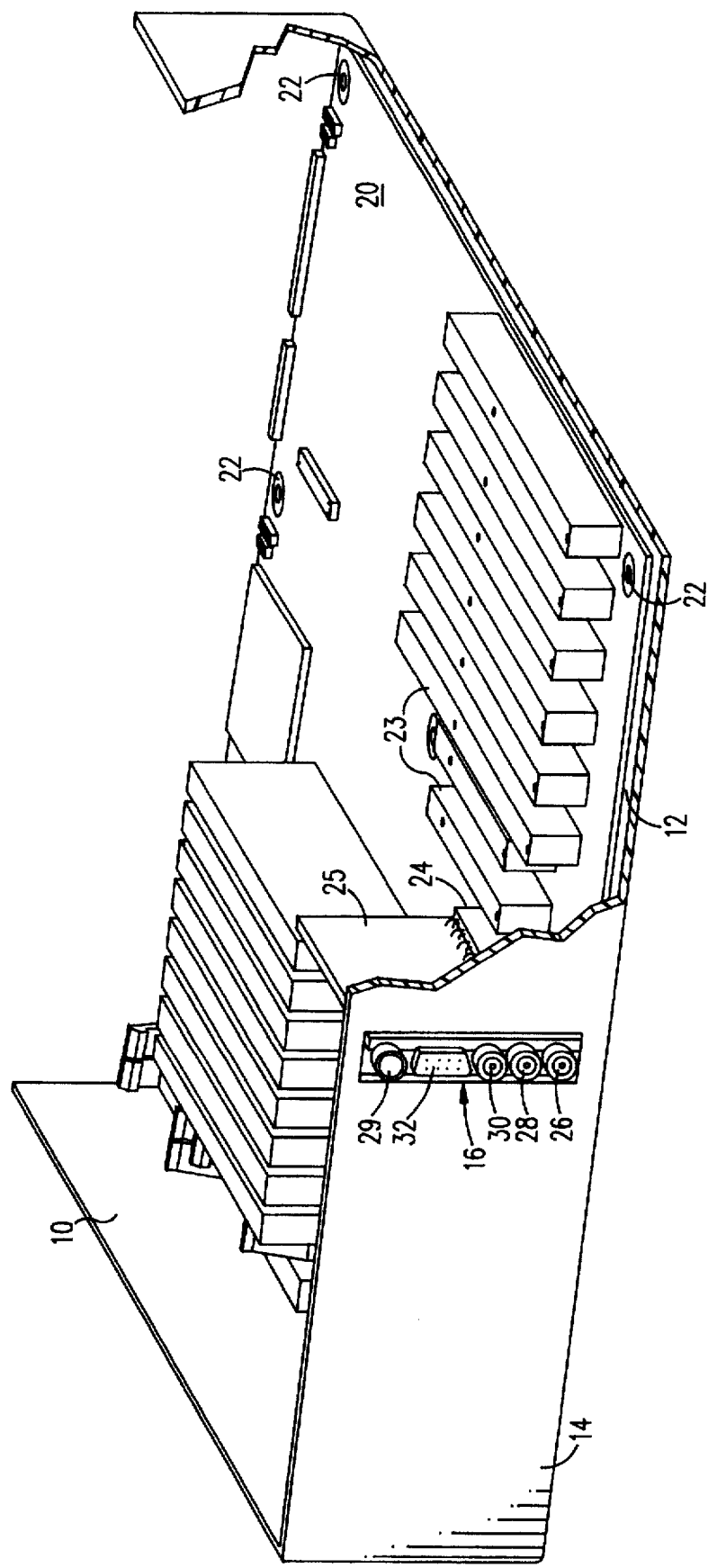
FIG. 1 is a rear perspective view of a computer system in which the present invention is embodied.

Refer to FIG. 1 which is a rear view of a computer system in which the present invention is embodied. The computer is shown with its top cover removed and the chassis partially broken away.

A computer is housed in a chassis (10) having a bottom panel (12) and a rear panel (14) substantially perpendicular to the bottom panel. The rear panel has cutouts, such as cutout (16) to accommodate Industry Standard Architecture (ISA) expansion cards that connect the computer electronics to peripheral devices. A large printed circuit board at the bottom of the chassis, called a system board or motherboard (20), holds the computer's control circuitry and other electronics. The motherboard (20) is secured to the chassis substantially in parallel with the bottom panel (12) by fasteners (22). Hardware options in the form of printed circuit expansion cards are plugged directly into expansion sockets (23) on the motherboard. The mother board (20) includes a 17-pin socket (24) in one of the expansion slots associated with a standard ISA cutout (16) in the rear panel (14).

Figure 2:
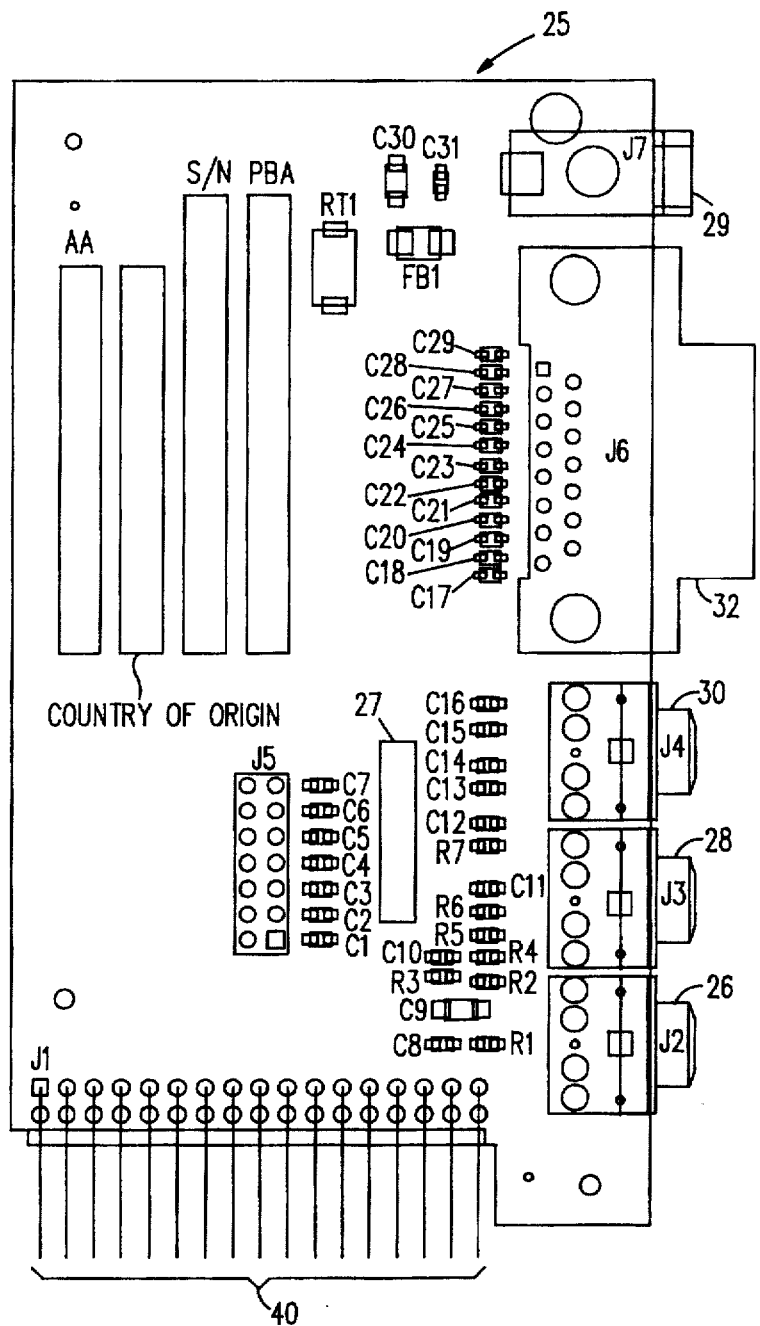
FIG. 2 is a front view of an audio card that mates with a socket on the motherboard shown in FIG. 1.
Figure 3:
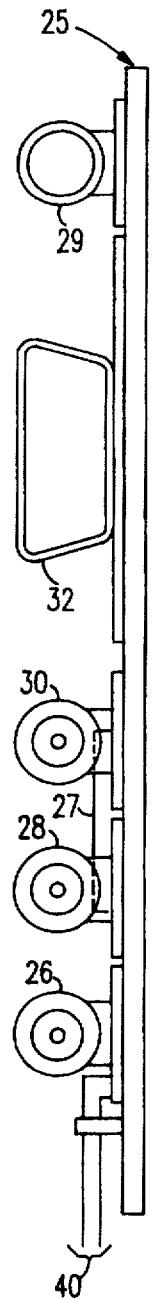
FIG. 3 is side view of the audio card shown in FIG. 2.

Refer to FIG. 2 which is a front view and FIG. 3 which is side view of the audio card (25) that mates with the mating socket (24) on the motherboard shown in FIG. 1. The audio card (25), a small printed circuit board, is mounted in the socket (24) substantially perpendicular to the motherboard (20). The audio card has a Microphone input connector (26), a Line-in connector (28), speaker power (29) a Line-out connector (30), and a joystick/MIDI D-shell connector (32) mounted on an edge of the audio card. The connectors on the audio card are aligned with the standard ISA cutout (16) in the rear panel. An electromagnetic interference (EMI) gasket contoured to the cutout (16) grounds the audio card to the chassis. EMI suppressive components C1 through C29 are mounted on the card. At the bottom edge of the card (25) are input/output pins (40) in two rows of 17 pins each for a total of 34 pins that mate with the 34 pin sockets in the mating socket (24).

Whereas the socket (24) is shown as a 34 pin (2 pin by 17 pin) connector socket, those skilled in the art will realize that as new connector designs are introduced they may be incorporated into the audio card.

Figure 4:
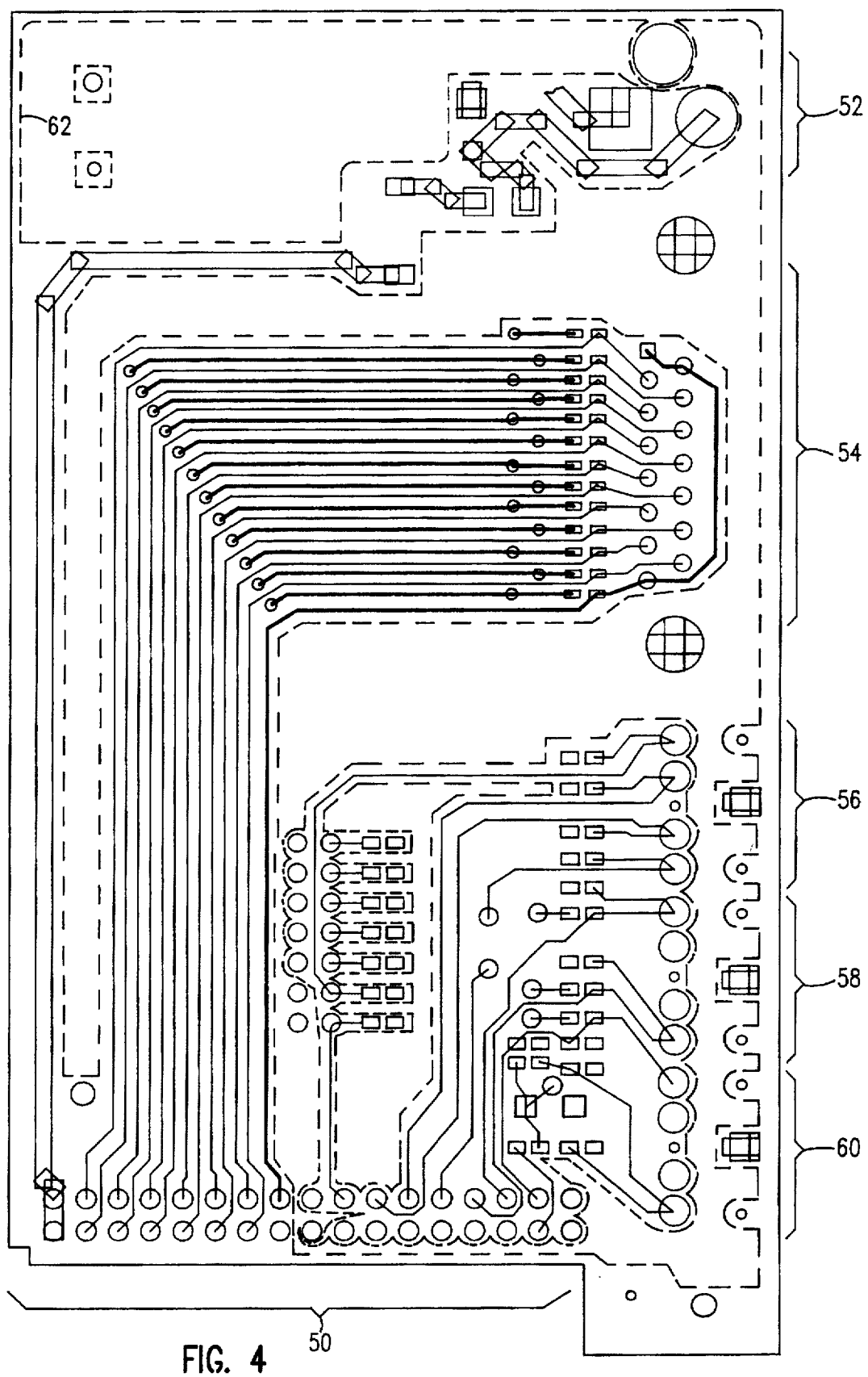
FIG. 4 is front view of the printed wiring on the audio card shown in FIG. 2.

Refer to FIG. 4 which is a front view of the printed wiring on the audio card shown in FIG. 2. The pinout of the pins

(40) shown in FIG. 2 is chosen to minimize the printed wiring trace length and maximize shielding of the audio signals. The pinout of this connector is shown in TABLE 1. The trace wiring pads (50) at the bottom of FIG. 4 connect to the pins (40) shown in FIG. 2. The wiring pads (52) correspond to speaker power (29). The wiring pads (54) correspond to joystick/MIDI connector (32). The wiring pads (56) correspond to Line-out connector (30). The wiring pads (58) correspond to Line-in connector (28). The wiring pads (60) correspond to Microphone input connector (26). The ground island created during manufacturing by the metal that is not etched away during the creation of the trace wiring pads (50, 52, 54, 56, 58, and 60) is illustrated in FIG. 4 by the broken lines (62). The ground island is soldered to the ground pins as is conventional in printed circuit board manufacturing.

TABLE I

| Gameport VCC | 1 | 2 | Gameport VCC |
|---|---|---|---|
| Joystick Button 0 | 3 | 4 | Joystick Button 2 |
| Joystick 1 X-axis | 5 | 6 | Joystick 2, X-axis |
| Digital Ground | 7 | 8 | Midi-Out |
| Digital Ground | 9 | 10 | Joystick 2, Y-axis |
| Joystick 1, Y-axis | 11 | 12 | Joystick Button 3 |
| Joystick Button 1. | 13 | 14 | Midi-In |
| Gameport VCC | 15 | 16 | Mono-Out |
| KEY | 17 | 18 | Mono-In |
| Line-out, Right | 19 | 20 | Analog Ground |
| Speaker-Return, Right | 21 | 22 | Analog Ground |
| Speaker-Return, Left | 23 | 24 | +12 v |
| Line-out, Left | 25 | 26 | Analog Ground |
| Line-in, Right | 27 | 28 | −12 v |
| Line-in, Left | 29 | 30 | Analog Ground |
| Microphone-in | 31 | 32 | +12 v |
| Analog Ground | 33 | 34 | Analog Ground |

The EMI suppressive components C1 through C29 are placed on the audio card near the audio connectors, thereby significantly reducing EMI emissions relative to the prior art cabled apparatus. A preamplifier component (27) is placed on the card (25) in close proximity to the microphone input connector (26), thereby reducing low level wiring length. Provisions for microphone preamp circuitry included on the audio card improves the quality of the microphone signal as it enters the chassis.

The audio card is designed to fit into an ISA-standard opening in the rear of the chassis. This allows the use of the invention in all standard Baby-AT chassis.

As shown in the above table, low level audio signals that require shielding are placed near to pins that return to ground, to thereby maximize shielding of the signals. For example, the line-out, right signal is assigned pin number 19. A first analog ground is assigned pin number 20, which is adjacent to the line-out, right pin number 19. Also, the line-out, left signal is assigned pin number 25. A second analog ground is assigned pin number 26, which is adjacent to the line-out, left pin number 25. Similarly, the line-in, right signal is assigned pin number 27 which is adjacent to the analog ground pin 26 and the line-in, left signal is assigned pin number 29 which is adjacent to the analog ground pin 30. The microphone-in pin 31 is also adjacent to the analog ground pin 30.

While the invention has been particularly shown and described with reference to preferred embodiments thereof, it will be understood by those skilled in the art that the foregoing and other changes in form and detail may be made therein without departing from the scope of the invention.

What is claimed is:

1. An audio apparatus comprising:

a printed circuit board;

an audio connector mounted on a first edge of said printed circuit board;

a number of pins at a second edge of said printed circuit board;

said audio connector being electrically connected by a printed circuit wiring trace to a pin of said number of pins;

pins of said number of pins including, a line-out, right pin;

a first analog ground pin adjacent to said line-out, right pin;

a line-in, right pin;

a second analog ground pin adjacent to said line-in, right pin;

a line-out, left pin;

a third analog ground pin adjacent to said line-out, left pin;

a line-in, left pin; and, a fourth analog ground pin adjacent to said line-in, left pin.

2. The apparatus in accordance with claim 1 wherein said number of pins comprise a 2X17 pin connector.

3. The apparatus in accordance with claim 1 wherein electromagnetic interference suppressive components are mounted on said card near said audio connectors.

4. The apparatus in accordance with claim 1 wherein electromagnetic interference suppressive components are mounted on said card near said audio connectors.

5. An audio apparatus comprising:

a printed circuit board;

a number of audio connectors mounted on a first edge of said printed circuit borad;

said number of audio connectors including, a microphone input connector;

a line-in connector;

a speaker power connector;

a line-out connector; and, a joystick/MIDI D-shell connector;

said audio connectors being mounted on a first edge of said printed circuit board;

a number of pins at a second edge of said printed circuit board;

pins of said number of pins being connected by printed circuit wiring to said audio connectors.

6. The apparatus in accordance with claim 5 wherein said number of pins includes:

a line-out, right pin;

a first analog ground pin adjacent to said line-out, right pin;

a line-in, right pin;

a second analog ground pin adjacent to said line-in, right pin;

a line-out, left pin;

a third analog ground pin adjacent to said line-out, left pin;

a line-in, left pin; and, a fourth analog ground pin adjacent to said line-in, left pin.

7. The apparatus in accordance with claim 5 wherein said number of pins comprise a 2X17 pin connector.

8. The apparatus in accordance with claim 5 wherein electromagnetic interference suppressive components are mounted on said card near said audio connectors.

9. An audio apparatus comprising:

a printed circuit board;

an audio connector mounted on a first edge of said printed circuit board;

a number of pins at a second edge of said printed circuit board;

said audio connector being electrically connected by a printed circuit wiring trace to a pin of said number of pins;

pins of said number of pins including, a line-out, right pin;

a first analog ground pin adjacent to said line-out, right pin;

a line-in, right pin;

a second analog ground pin adjacent to said line-in, right pin;

a line-out, left pin;

a third analog ground pin adjacent to said line-out, left pin;

a line-in, left pin; and a fourth analog ground pin adjacent to said line-in, left pin.

10. The apparatus in accordance with claim 9 wherein said number of pins comprise a 2X17 pin connector.

11. An audio apparatus comprising:

a printed circuit board;

a number of audio connectors mounted on a first edge of said printed circuit board;

said number of audio connectors including, a microphone input connector;

a line-in connector;

a speaker power connector;

a line-out connector;

a joystick/MIDI D-shell connector;

said audio connectors being mounted on a first edge of said printed circuit board; and, a number of pins at a second edge of said printed circuit board;

pins of said number of pins being connected by printed circuit wiring to said audio connectors.

12. The apparatus in accordance with claim 11 wherein said number of pins includes:

a line-out, right pin;

a first analog ground pin adjacent to said line-out, right pin;

a line-in, right pin;

a second analog ground pin adjacent to said line-in, right pin;

a line-out, left pin;

a third analog ground pin adjacent to said line-out, left pin;

a line-in, left pin; and, a fourth analog ground pin adjacent to said line-in, left pin.

13. The apparatus in accordance with claim 11 wherein said number of pins comprise a 2X17 pin connector.

14. The apparatus in accordance with claim 11 wherein electromagnetic interference suppressive components are mounted on said card near said audio connectors.

* * * * *